US006794700B1

(12) United States Patent
Beach et al.

(10) Patent No.: US 6,794,700 B1
(45) Date of Patent: Sep. 21, 2004

(54) CAPACITOR HAVING A DIELECTRIC LAYER INCLUDING A GROUP 17 ELEMENT

(75) Inventors: Eric Beach, Tucson, AZ (US); Weidong Tian, Dallas, TX (US); Pinghai Hao, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 4 days.

(21) Appl. No.: 10/411,522

(22) Filed: Apr. 10, 2003

(51) Int. Cl.[7] ................................................ H01L 29/92
(52) U.S. Cl. ........................ 257/296; 257/306; 257/532
(58) Field of Search ................................ 257/296, 306, 257/532

(56) References Cited

U.S. PATENT DOCUMENTS

| | | | | |
|---|---|---|---|---|
| 5,352,622 A | * 10/1994 | Chung | ........................ | 438/396 |
| 5,383,088 A | * 1/1995 | Chapple-Sokol et al. | ... | 361/305 |
| 5,393,691 A | * 2/1995 | Hsu et al. | ................... | 438/210 |
| 5,965,918 A | * 10/1999 | Ono | ........................... | 257/347 |
| 6,103,601 A | * 8/2000 | Lee et al. | ................... | 438/513 |
| 6,191,463 B1 | * 2/2001 | Mitani et al. | ............... | 257/411 |

OTHER PUBLICATIONS

A. Kazor, C. Jeynes, and Ian W. Boyd; "Fluorine Enhanced Oxidation of Silicon at Low Temperatures"; Applied Physics Letter 65 (12), Sep. 1994, pp. 1572–1574.
A. Balasinski, L. Vishnubhotla and T.P. Ma, H.–H. Tseng and P.J. Tobin; "Fluorinated CMOSFETs Fabricated on (100) and (111) Si Substrates"; "Effect of Fluorine on Chemical and Electrical Properties of Room Temperature Oxide Films Prepared by Plasma Enhanced Chemical Vapor Deposition"; Applied Physics Letter, vol. 72, No. 10; Mar. 9, 1998, pp. 95–99.
Yasushiro Nishioka, Yuzuro Ohji, Kiichiro Mukai, Takuo Sugano, Yu Wang and T.P. Ma: "Dielectric Characteristics of Fluorinated Ultradry SIO2"; Applied Physics Letter 54 (12) Mar. 20, 1989, pp. 1127–1129.
U.S. Kim and R.J. Jaccodine; "Fast Shrinkage of Oxidation Stacking Faults During $O_2/NF_3$ Oxidation of Silicon"; Applied Physics Letter 49 (18) Nov. 3, 1986, pp. 1201–1203.
M. Morita, S. Aritome, M. Tsukude, T. Murakawa and M. Hirose; "Low–Temperature $SiO_2$Growth Using Fluorine–Enhanced Thermal Oxidation"; Applied Physics Letter 47 (3), Aug. 1, 1985, pp. 253–255.
Lakshmanna Vishnubhotla, T.P. Ma, Hsing–Huang Tseng and Philip J. Tobin; "Interface Trap Generation and Electron Trapping in Fluorinated $SiO_2$"; Applied Physics Letter 59 (27) Dec. 30, 1991, pp. 3595–3597.
D. Kouvatsos, F.P. McCluskey, R. J. Jaccodine and F.A. Stevie; "Silicon Fluorine Bonding and Fluorine Profiling in $SiO_2$Films Grown by NF3–Enhanced Oxidation" Applied Physics Letter 61 (7) Aug. 17, 1992, pp. 780–782.
S.P. Kim, S.K. Choi, Youngsoo Park and Llsub Chung; "Effect of $N_2$ O Plasma Treatment on the Stabilization of Water Absorption in Fluorinated Silicon–Oxide Thin Films Fabricated by Electron–Cyclotron–Resonance Plasma–Enhanced Chemical–Vapor Deposition"; Applied Physics Letters, vol. 80, No. 10, Mar. 11, 2002; pp. 1728–1729.
Kihong Kim, Juho Song, Daehyuk Kwon and G.S. Lee; "Effect of Fluorine on Chemical and Electrical Properties of Room Temperature Oxide Films Prepared by Plasma Enhanced Chemical Vapor Deposition"; Applied Physics Letters, vol. 72, No. 10, Mar. 9, 1998 pp. 1247–1249.

* cited by examiner

*Primary Examiner*—Allan R. Wilson
(74) *Attorney, Agent, or Firm*—Peter K. McLarty; W. James Brady, III; Frederick J. Telecky, Jr.

(57) ABSTRACT

The present invention provides a capacitor 300, a method of manufacture therefor and an integrated circuit including the same. In one embodiment of the invention, the capacitor 300 includes a first conductive plate 320 located over a semiconductor substrate 310, wherein the first conductive plate 320 has a second conductive plate 340 located thereover. The capacitor 300, in the same embodiment, further includes a dielectric layer 330 located between the first conductive plate 320 and the second conductive plate 340, wherein the dielectric layer 330 includes a Group 17 element.

12 Claims, 13 Drawing Sheets

| Split | Vcc2 (ppm/V2) | Vcc1 (ppm/V) |
|---|---|---|
| Baseline | -3.2047 | 1.8522 |
| Fluorine implant (2e15, 25keV) | -0.1835 | -0.1337 |
| Fluorine implant (2e15, 15keV) | -0.7289 | 1.2407 |
| Fluorine implant (2e15, 10keV) | -1.1398 | 1.1171 |

| Split | DA (ppm) |
|---|---|
| Baseline | 163.3 |
| Plasma Fluorine | 95 |

CAPACITOR HAVING A DIELECTRIC LAYER INCLUDING A GROUP 17 ELEMENT

TECHNICAL FIELD OF THE INVENTION

The present invention is directed, in general, to capacitors and, more specifically, to a capacitor having a dielectric layer including a Group 17 element and a method of manufacture therefor.

BACKGROUND OF THE INVENTION

Capacitor arrays are currently one of the main building blocks for many high performance analog/mixed signal products like delta sigma analog to digital converters (ADCs), successive approximation register analog to digital converters (ADCs), pipeline analog to digital converters (ADCs), PGAs, precision reference switched analog filters, Codecs, etc. It is required, however, that the individual capacitors within these capacitor arrays be high precision capacitors. Recently, two parameters have been used to scrutinizes whether a certain capacitor meets the requirements required for use in one of the aforementioned capacitor arrays.

A first parameter tested to determining whether a certain capacitor meets the requirements to be considered a high precision capacitor is the capacitor's voltage coefficient value. While an ideal capacitor's capacitance is independent of the voltage being applied to it, those skilled in the art are aware that such capacitors are hard to come by. For this reason, the industry has developed a value to characterize how dependent a capacitor's capacitance is upon the voltage being applied thereto, in other words a capacitor's voltage coefficient value.

Turning to Prior Art FIG. 1, illustrated is a graph 100 plotting a specific capacitor's capacitance value for a number of different voltages. By fitting a resulting curve 110 with an equation, a voltage coefficient value 120 may be obtained. The particular voltage coefficient value 120 resulting from the capacitor graphed in FIG. 1 is:

$$y=-3.2047E-06x^2+1.8522E-06x+1.0000E+00$$

As is noticed, the voltage coefficient value 120 has both a linear voltage coefficient value and a quadratic voltage coefficient value. It is desired that both of these values be as small as possible, and ideally equal to zero. Unfortunately, the voltage coefficient values currently achievable by conventional capacitors are often insufficient to meet the needs of the capacitor arrays mentioned above.

Another parameter those skilled in the art look to for determining whether a certain capacitor meets the requirements of being considered a high precision capacitor, is the capacitor's dielectric absorption value. Ideal capacitors return to their original state after being charged and dissipated any number of times. However, such ideal capacitors are quite difficult to manufacture, and therefore are difficult to obtain. For this reason, the industry has developed a value to characterize the amount of charge that remains within a capacitor after the voltage has been removed, in other words a capacitor's dielectric absorption value.

Turning to Prior Art FIG. 2, shown is a depiction 200 of three electrical situations 210, 220, 230 that a capacitor might experience. The first situation 210 is a situation where the capacitor is being charged. In the particular example shown, the capacitor is being charged using a 1 volt source ($V_0$). The second situation 220 is a situation where the charged capacitor is being discharged. In an ideal scenario, the charge remaining in the capacitor after its discharged is zero. The third situation 230, however, illustrates an actual situation where a charge remains after the capacitor has been discharged. In the particular example shown, the remaining charge ($V_1$) is about 1 mV. The capacitor's dielectric absorption value may, then, be calculated by dividing the charge remaining in the capacitor ($V_1$) by the source voltage ($V_0$) applied thereto. As those skilled in the art are well aware, it is desired that a specific capacitor's dielectric voltage value be as small as possible, and optimally zero. The dielectric voltage values currently achievable by conventional capacitors are, however, often insufficient to meet the needs of the capacitor arrays mentioned above.

Accordingly, what is needed in the art is a capacitor that has smaller voltage coefficient values or dielectric absorption values than those of the prior art.

SUMMARY OF THE INVENTION

To address the above-discussed deficiencies of the prior art, the present invention provides a capacitor, a method of manufacture therefor and an integrated circuit including the same. In one embodiment of the invention, the capacitor includes a first conductive plate located over a semiconductor substrate, wherein the first conductive plate has a second conductive plate located thereover. The capacitor, in the same embodiment, further includes a dielectric layer located between the first conductive plate and the second conductive plate, wherein the dielectric layer includes a Group 17 element.

The present invention alternatively provides a method of manufacturing a capacitor. In one embodiment of the present invention, the method of manufacturing the capacitor includes forming a first conductive plate over a semiconductor substrate, and placing a second conductive plate over the first conductive plate. The method further includes locating a dielectric layer between the first conductive plate and the second conductive plate, the dielectric layer including a Group 17 element.

The present invention further provides an integrated circuit including the capacitor. In addition to those features disclosed with respect to the capacitor, the integrated circuit includes transistors formed over or in the semiconductor substrate, as well as interconnects contacting the transistors and the capacitor to form an integrated circuit.

The foregoing has outlined preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention.

BRIEF DESCRIPTION OF THE DRAWINGS

For a more complete understanding of the present invention, reference is now made to the following detailed description taken in conjunction with the accompanying FIGUREs. It is emphasized that various features may not be drawn to scale. In fact, the dimensions of various features may be arbitrarily increased or reduced for clarity of discussion. In addition, it is emphasized that some circuit components may not be illustrated for clarity of discussion. Reference is now made to the following descriptions taken in conjunction with the accompanying drawings, in which:

Prior Art

Prior Art

FIG. 4 illustrates a graph comparing voltage coefficient values for a first situation characterized by a conventional capacitor not having fluorine located within the dielectric layer, to second, third and fourth situations characterized by capacitors of the present invention having fluorine implanted within the dielectric layer using three different energies;

FIG. 5 illustrates a graph comparing dielectric absorption values for a first situation characterized by a conventional capacitor not having fluorine located on the dielectric layer, to a second situation characterized by a capacitor of the present invention having fluorine located on the dielectric layer;

DETAILED DESCRIPTION

Figure 1:
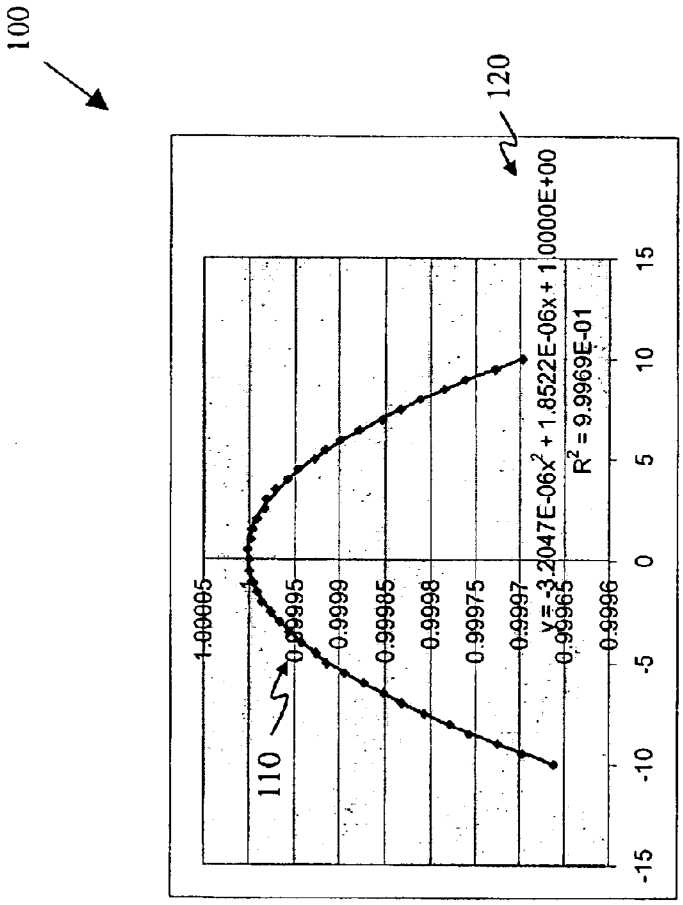
FIG. 1 illustrates a graph showing a particular capacitor's voltage coefficient value.
Figure 2:
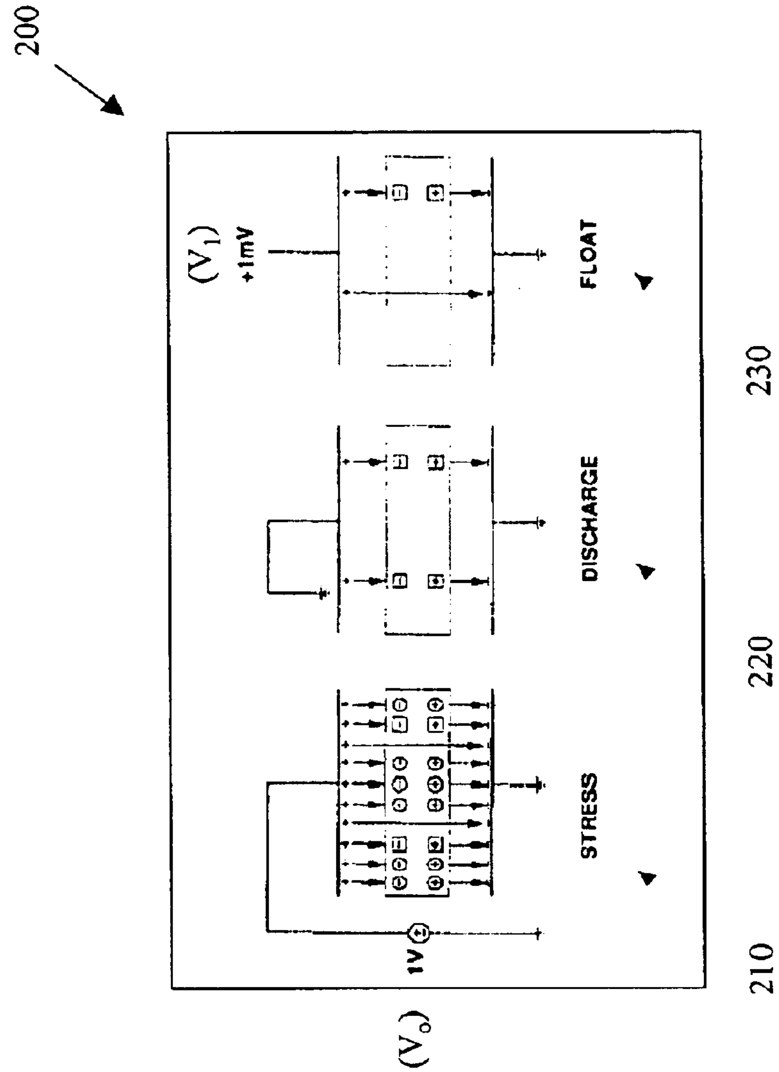
FIG. 2 illustrates three electrical situations that a capacitor might experience.
Figure 3:
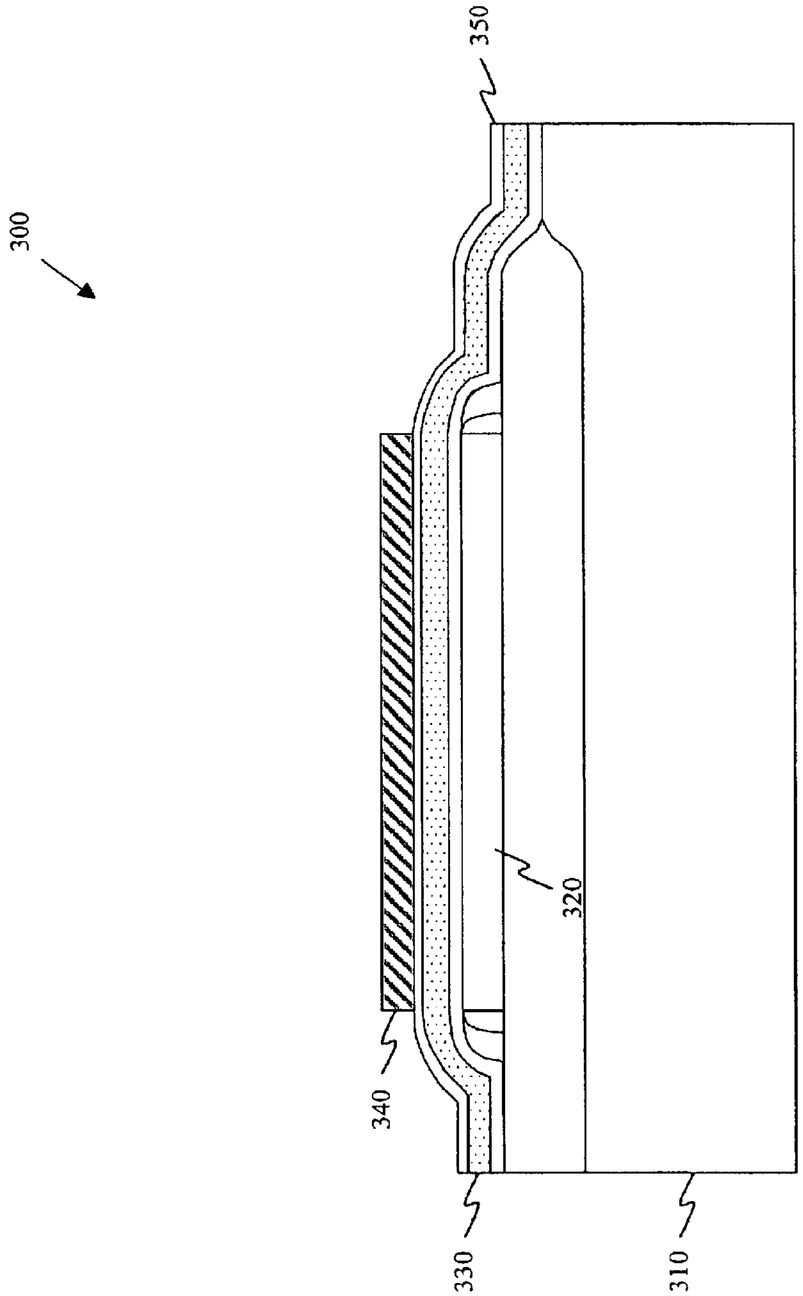
FIG. 3 illustrates a cross-sectional view of one embodiment of a capacitor constructed in accordance with the principles of the present invention.

Referring initially to FIG. 3 illustrated is a cross-sectional view of one embodiment of a capacitor 300 constructed in accordance with the principles of the present invention. The particular capacitor 300 illustrated in FIG. 3, which may in one embodiment be a high precision capacitor for use in a delta sigma analog to digital converters (ADCs), successive approximation register analog to digital converters (ADCs), pipeline analog to digital converters (ADCs), PGAS, precision reference switched analog filters, Codecs, or another similar device, initially includes a semiconductor substrate 310. As is illustrated, first and second conductive plates 320, 340, respectively, are located over the semiconductor substrate 310.

The capacitor 300 further includes a dielectric layer 330 located between the first and second conductive plates 320, 340. In accordance with the principles of the present invention, the dielectric layer 330 includes a Group 17 element (International Union of Pure & Applied Chemistry (IUPAC) convention). As used herein with respect to the dielectric layer, the term "includes" embraces embodiments where the Group 17 element is located within the dielectric layer 330, as well as embodiments where the Group 17 element is located on a surface of the dielectric layer 330. The term "includes" also embraces an embodiment where the Group 17 element is both located within and on a surface of the dielectric layer 330. While the Group 17 element may include any of the halogen elements, fluorine is particularly useful.

The capacitor 300 of the present invention having the dielectric layer 330 including the Group 17 element, experiences certain advantages not experienced by conventional capacitors. For example, in those embodiments wherein the Group 17 element is located within the dielectric layer 330, the capacitor 300 experiences an improved voltage coefficient value. Likewise, in those embodiments where the Group 17 element is located on the dielectric layer 330, such as the layer of the Group 17 element 350, the capacitor 300 experiences an improved dielectric absorption value.

Turning to FIG. 4, illustrated is a table 400 comparing voltage coefficient values for a first situation 410 characterized by a conventional capacitor not having fluorine located within the dielectric layer, to second, third and fourth situations 420*a–c* characterized by capacitors of the present invention having fluorine implanted within the dielectric layer using three different energies. As is illustrated, the second, third and fourth situations 420*a–c* experience substantially lower voltage coefficient values that the first situation 410. Particularly, where the first situation 410 is capable of achieving a quadratic voltage coefficient value of about −3.2047 ppm, the second situation 420*a* is capable of achieving a quadratic voltage coefficient value of about −0.1835 ppm. Accordingly, the quadratic voltage coefficient value of the situation 420*a* having the fluorine implanted within the dielectric layer is greater than about one order of magnitude better than the quadratic voltage coefficient value of the situation 410 not including the fluorine. The other two situations 420*b–c*, as well as the linear voltage coefficient values, showed similar results.

Turning to FIG. 5, illustrated is a table 500 comparing dielectric absorption values for a first situation 510 characterized by a conventional capacitor not having fluorine located on the dielectric layer, to second situation 520 characterized by a capacitor of the present invention having fluorine located on the dielectric layer. As is illustrated, the capacitor having the fluorine on the dielectric layer experiences a substantially lower dielectric absorption value than the conventional capacitor. For example, in the illustrative example the conventional capacitor experienced about a 163.3 ppm dielectric absorption value wherein the novel capacitor experienced only about a 95 ppm dielectric absorption value. As is evident, a capacitor constructed in accordance with the principles of the present invention has a dielectric absorption value almost twice as low as the conventional structures.

Figure 6:
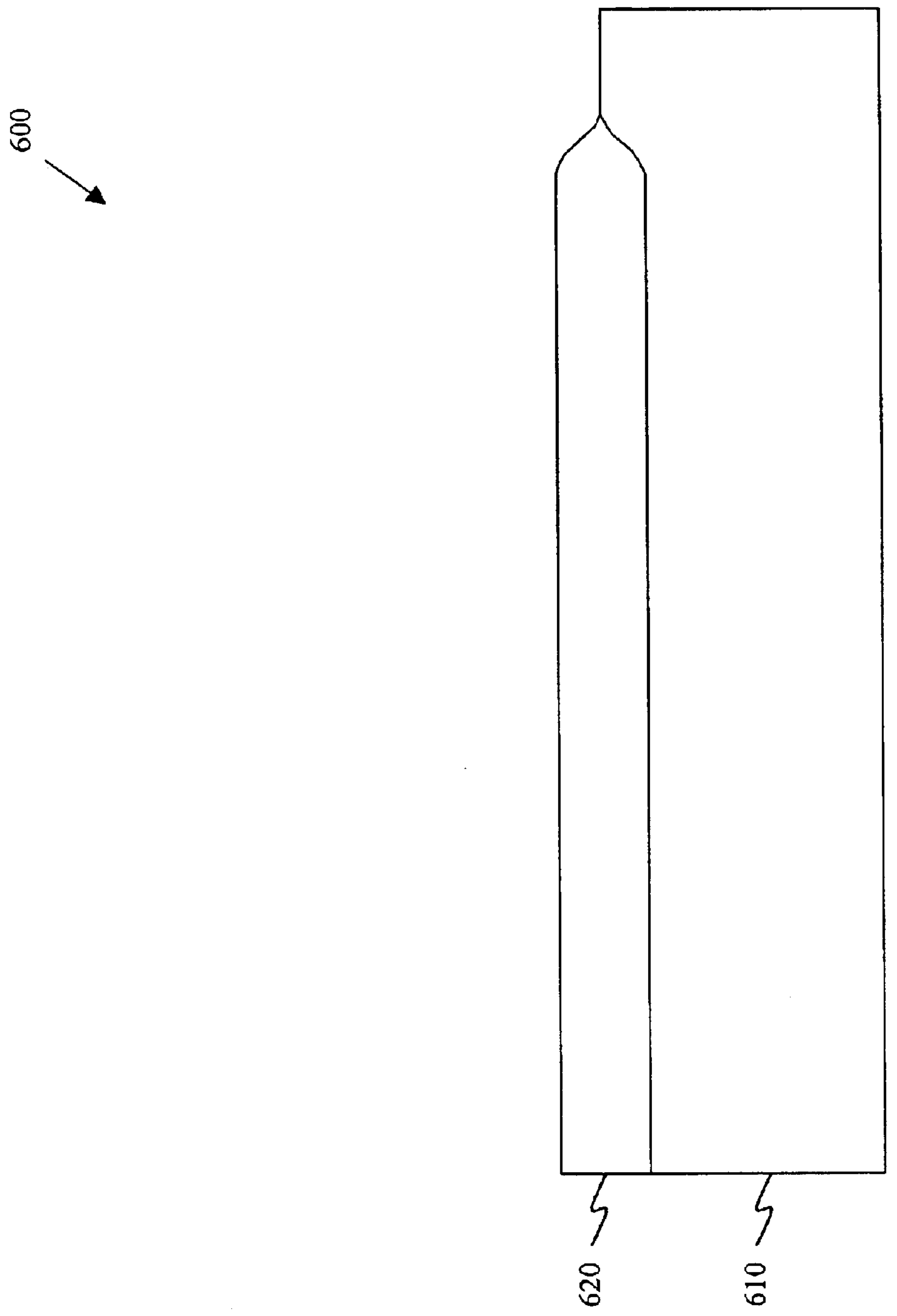
FIG. 6 illustrates a cross-sectional view of an embodiment of a capacitor at an initial stage of manufacture.

Turning now to FIGS. 6–12, illustrated are cross-sectional views of various stages of manufacture of a capacitor constructed in accordance with the principles of the present invention. Referring to FIG. 6, illustrated is a cross-sectional view of an embodiment of a capacitor 600 at an initial stage of manufacture. The method of manufacturing the capacitor 600 initiates with the supply of a semiconductor substrate 610. The semiconductor substrate 610 may, in one embodiment, comprise silicon having a p-type or n-type conductivity. Further, the semiconductor substrate 610 may have a 4-degree-off orientation or a <100> $C_z$ crystal structure. The semiconductor substrate 610 may also be a monolithic substrate (p-type or n-type doped) or may have a conventional epitaxial layer located thereon.

Located over the semiconductor substrate 610 in the particular embodiment shown in FIG. 6 is an oxide layer 620. In the particular embodiment shown, the oxide layer 620 is a field oxide layer and has a thickness ranging from about 100 nm to about 1000 nm. The oxide layer 620 is intended to provide electrical isolation between the conductive semiconductor substrate 610 and the features located thereover. Depending on the particular design of the capacitor 600 the oxide layer 620 may be formed using a number of different technique, including thermal growth, deposition or any other similar technique.

Figure 7:
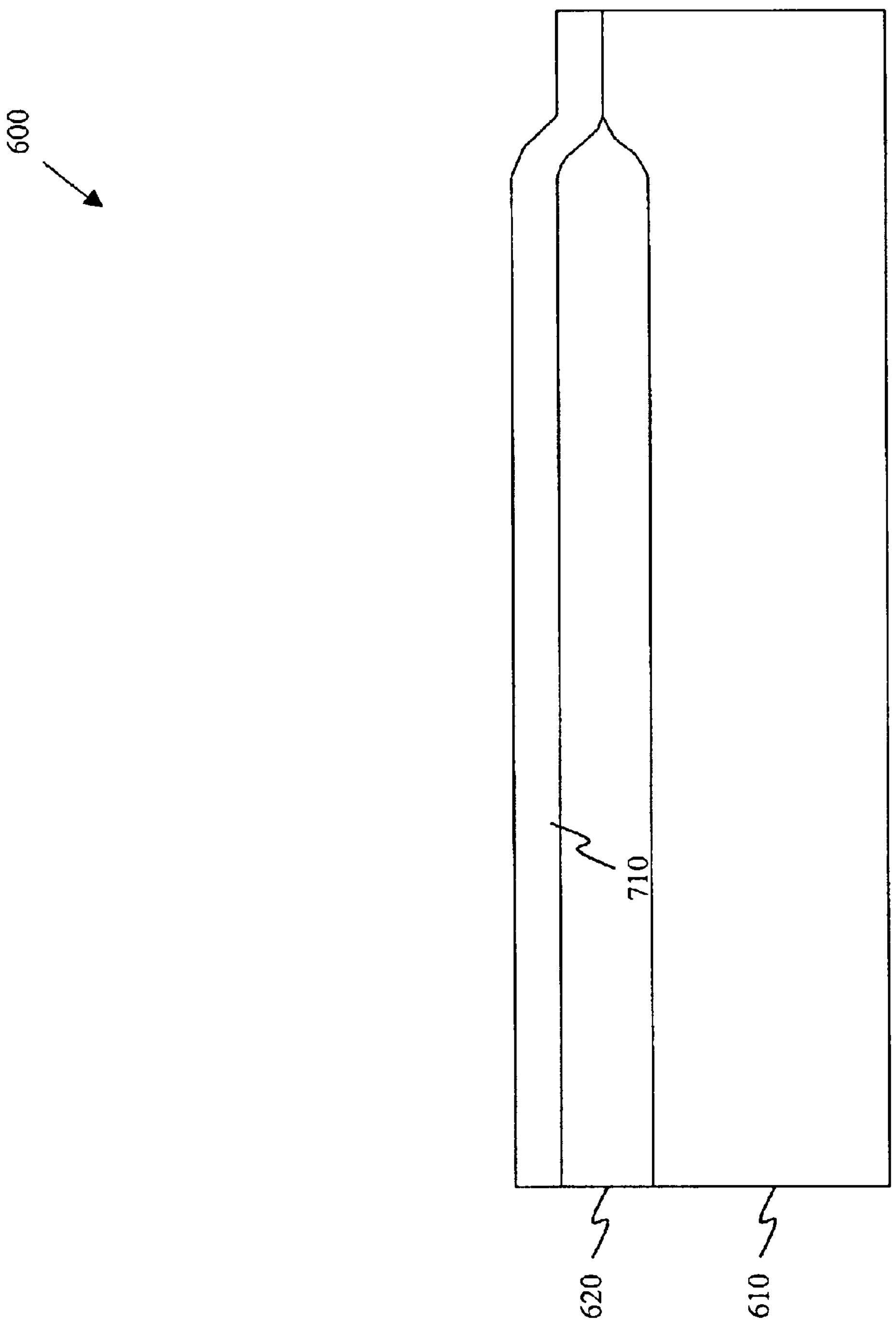
FIG. 7 illustrates a cross-sectional view of the capacitor illustrated in FIG. 6 after the blanket deposition of a first conductive plate over the semiconductor substrate.

Turning now to FIG. 7, illustrated is a cross-sectional view of the capacitor 600 illustrated in FIG. 6 after the blanket deposition of a first conductive plate 710 over the semiconductor substrate 610. The first conductive plate 710 may comprise any conductive material, including polysilicon that is subsequently doped to increase its conductivity. As shown in FIG. 7, the first conductive plate 710 preferably conforms to the oxide layer 620. Typically, the first conductive plate 710 has a thickness ranging from about 50 nm to about 600 nm.

Figure 8:
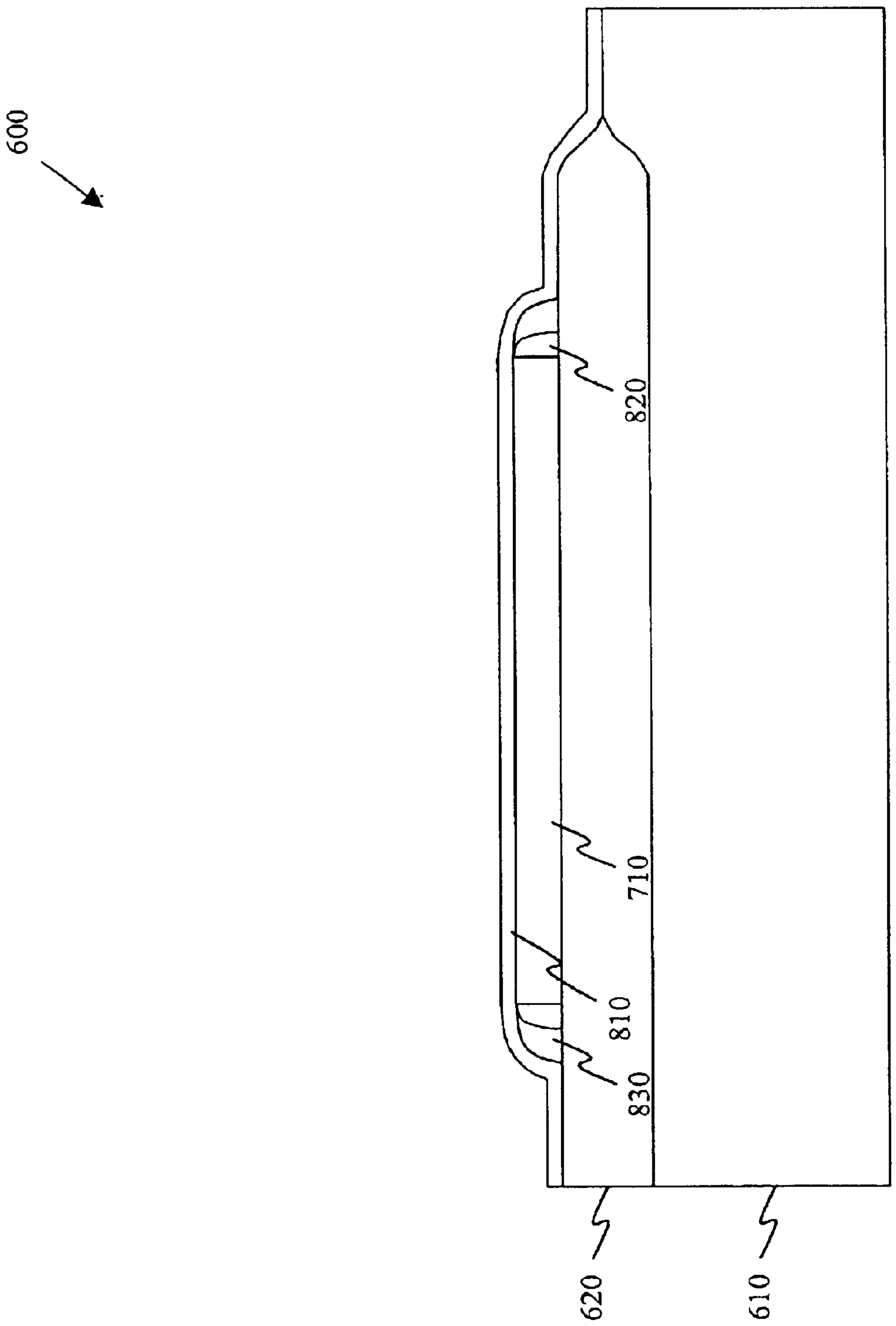
FIG. 8 illustrates a cross-sectional view of the capacitor shown in FIG. 7 after forming an optional low resistance contact layer over the first conductive plate.

Turning now to FIG. 8, illustrated is a cross-sectional view of the capacitor 600 shown in FIG. 7 after forming an optional low resistance contact layer 810 over the first conductive plate 710. While the low resistance contact layer 810 is optional, it is generally desired because it provides a good ohmic contact between a subsequently formed interconnect and the first conductive plate 710. In one exemplary embodiment of the invention the low resistance contact layer 810 comprises cobalt silicide that has been blanket deposited on the first conductive plate 710. While cobalt silicide has been listed as one potential low resistance contact layer 810 material, others are within the broad scope of the present invention.

The partially completed capacitor 600 of FIG. 8 further includes first and second sidewall spacer layers 820, 830 located to the left and right of the first conductive plate 710. In the illustrative embodiment shown in FIG. 8, the first and second sidewall spacer layers 820, 830 were conventionally formed after the first conductive plate 710 was defined.

Figure 9:
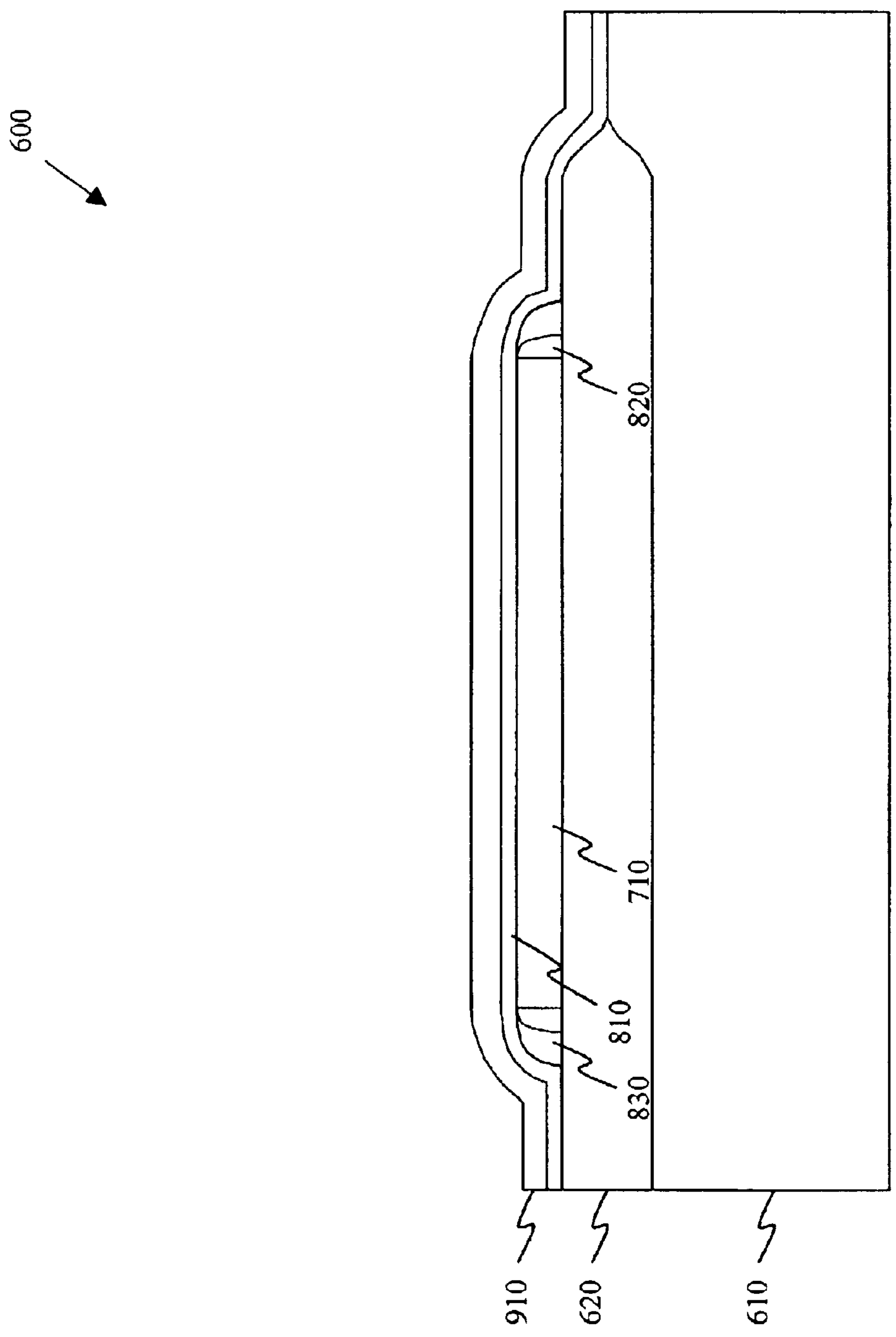
FIG. 9 illustrates a cross-sectional view of the capacitor illustrated in FIG. 8 after formation of a dielectric layer over the low resistance contact layer.

Turning now to FIG. 9, illustrated is a cross-sectional view of the capacitor 600 illustrated in FIG. 8 after formation of a dielectric layer 910 over the low resistance contact layer 810. The dielectric layer 910 may comprise any known capacitor dielectric material. In one particular embodiment the dielectric layer 910 comprises silicon dioxide or compounds thereof. For example, an exemplary embodiment of the present invention has the dielectric layer 910 comprising a tetraethylorthosilicate (TEOS) material.

The dielectric layer 910 may be conventionally blanket deposited using, for example a plasma enhanced chemical vapor deposition (PECVD) or other similar process. Alternatively, the dielectric layer 910 may be grown, using a thermal growth process. This particular growth embodiment is particularly useful if the low resistance contact layer 810 does not exist. Independent of the process used to form the dielectric layer 910, the dielectric layer 910 may be formed having a thickness ranging from about 10 nm to about 100 nm, and more particularly, having a thickness ranging from about 30 nm to about 65 nm. In one exemplary embodiment, the dielectric layer 910 has an optimum thickness of about 50 nm.

Figure 10A:
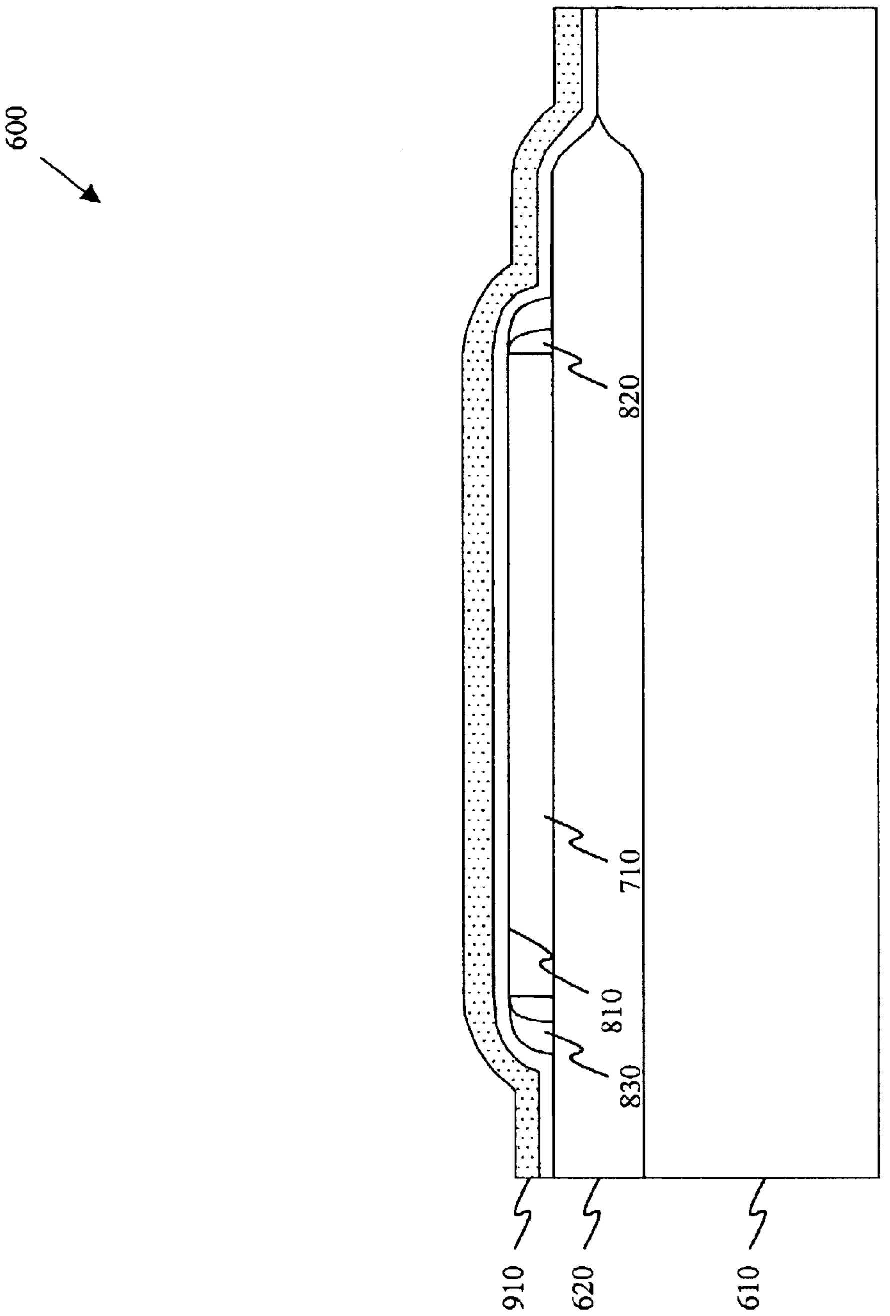
FIG. 10A illustrates a cross-sectional view of the capacitor illustrated in FIG. 9 after implanting a Group 17 element within the dielectric layer.

Turning now to FIG. 10A, illustrated is a cross-sectional view of the capacitor 600 illustrated in FIG. 9 after inclusion of a Group 17 element within the dielectric layer 910. The Group 17 element may comprise a number of different elements while staying within the broad scope of the present invention. For example, any halogen element could be included within the dielectric layer 910 and stay within the broad scope of the present invention. It has been found, however, that fluorine is an exemplary option as the Group 17 element.

The Group 17 element may be placed in the dielectric layer 910 using a number of different known processes. However, in one exemplary embodiment of the present invention the Group 17 element is implanted within the dielectric layer 910 using a specific dose of the Group 17 element. While the specific dose used may vary, a dose ranging from about 5E14 atoms/$cm^2$ to about 2E16 atoms/$cm^2$ is particularly useful. Within the aforementioned range of doses, it is believed that a dose of about 2E15 atoms/$cm^2$ provides beneficial results.

Similarly, the energy used to implant the Group 17 element may vary. This value, however, is strongly dependent on the thickness of the dielectric layer 910 of which the Group 17 element is being implanted. The resulting dielectric layer 910 optimally has a Group 17 element concentration ranging from about 1E18 atoms/$cm^3$ to about 1E22 atoms/$cm^3$, with a preferred range of about 1E20 atoms/$cm^3$ to about 5E21 atoms/$cm^3$. Moreover, it is believed that an exemplary concentration may be about 1E21 atoms/$cm^3$. Optimally, the peak concentration of the Group 17 element is located at an interface between the low resistance contact layer 810 and the dielectric layer 910.

While specific doses, concentrations and ranges have been discussed with respect to the dielectric layer 910, the present invention should not be limited to such doses, concentrations and energies. It should also be noted that the Group 17 element may be included within the dielectric layer 910 during its manufacture. For example, a Group 17 element gas could be used during the deposition of the dielectric layer 910, resulting in the dielectric layer 910 having the Group 17 element located therein. It is believed, however, that this method does not provide as many of the beneficial results as the implantation method referenced above. Nonetheless, regardless of the method used to include the Group 17 element within the dielectric layer 910, it is believed that the inclusion of the Group 17 element reduces a voltage coefficient value of the capacitor 600, that is as compared to a conventional capacitor not having the Group 17 element therein.

Figure 10B:
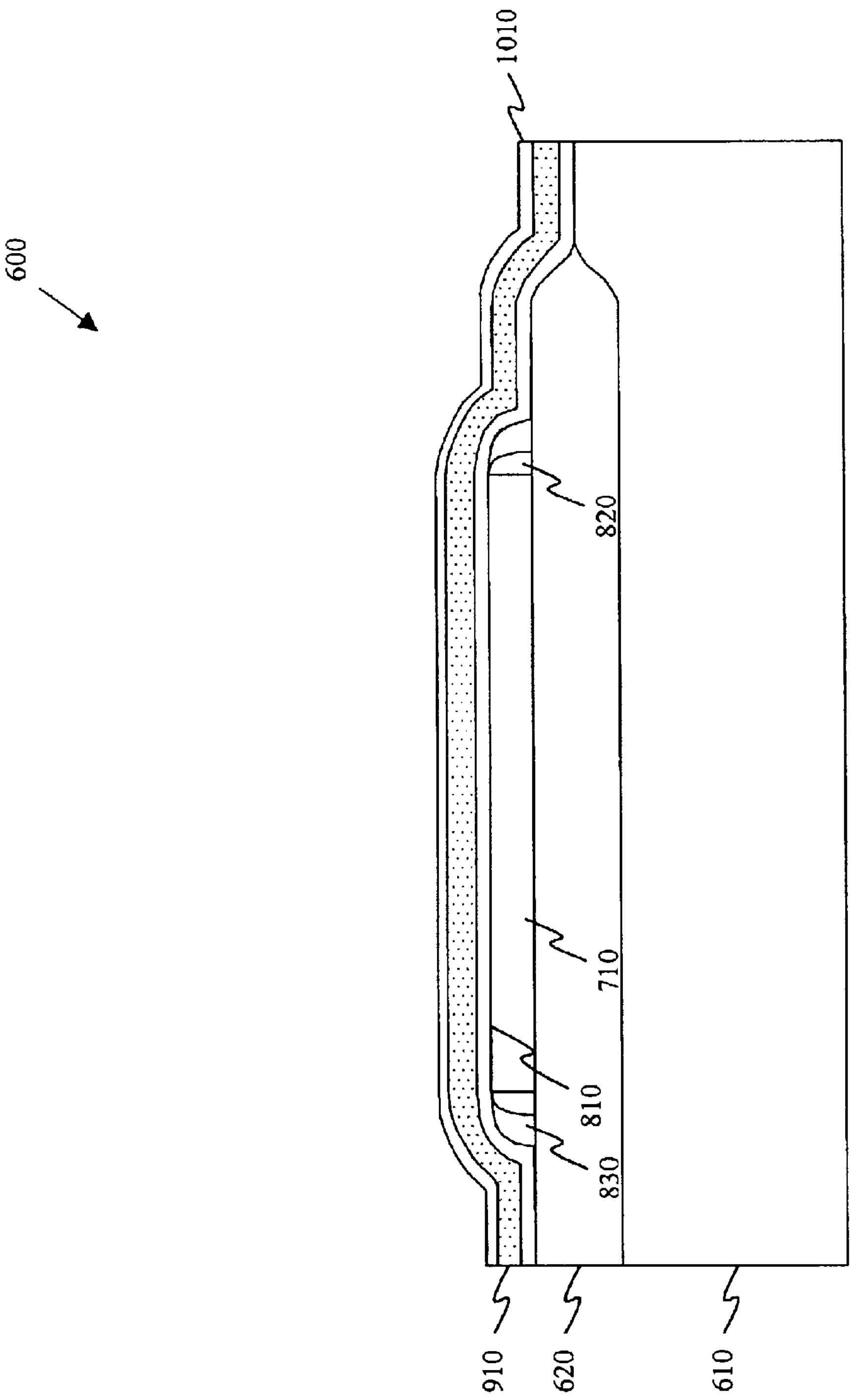
FIG. 10B illustrates a cross-sectional view of an alternative embodiment of the capacitor illustrated in FIG. 9 after of a Group 17 element on the dielectric layer.

Turning now to FIG. 10B, illustrated is a cross-sectional view of an alternative embodiment of the capacitor 600 illustrated in FIG. 9 after forming a layer of a Group 17 element 1010 on the dielectric layer 910. The layer of the Group 17 element 1010 is generally only atoms thick and, thus, typically only has a thickness ranging from about 0.5 nm to about 5 nm. Often, a plasma enhanced chemical vapor deposition (PECVD) or other similar process is used to form such a layer (for example plasma treatment of deposited TEOS). It is believed that the layer of the Group 17 element 1010 reduces a dielectric absorption value of the capacitor 600. For example, the capacitor 600 constructed in accordance with the principles of the present invention may have dielectric absorption values less than about 155 ppm.

Figure 11:
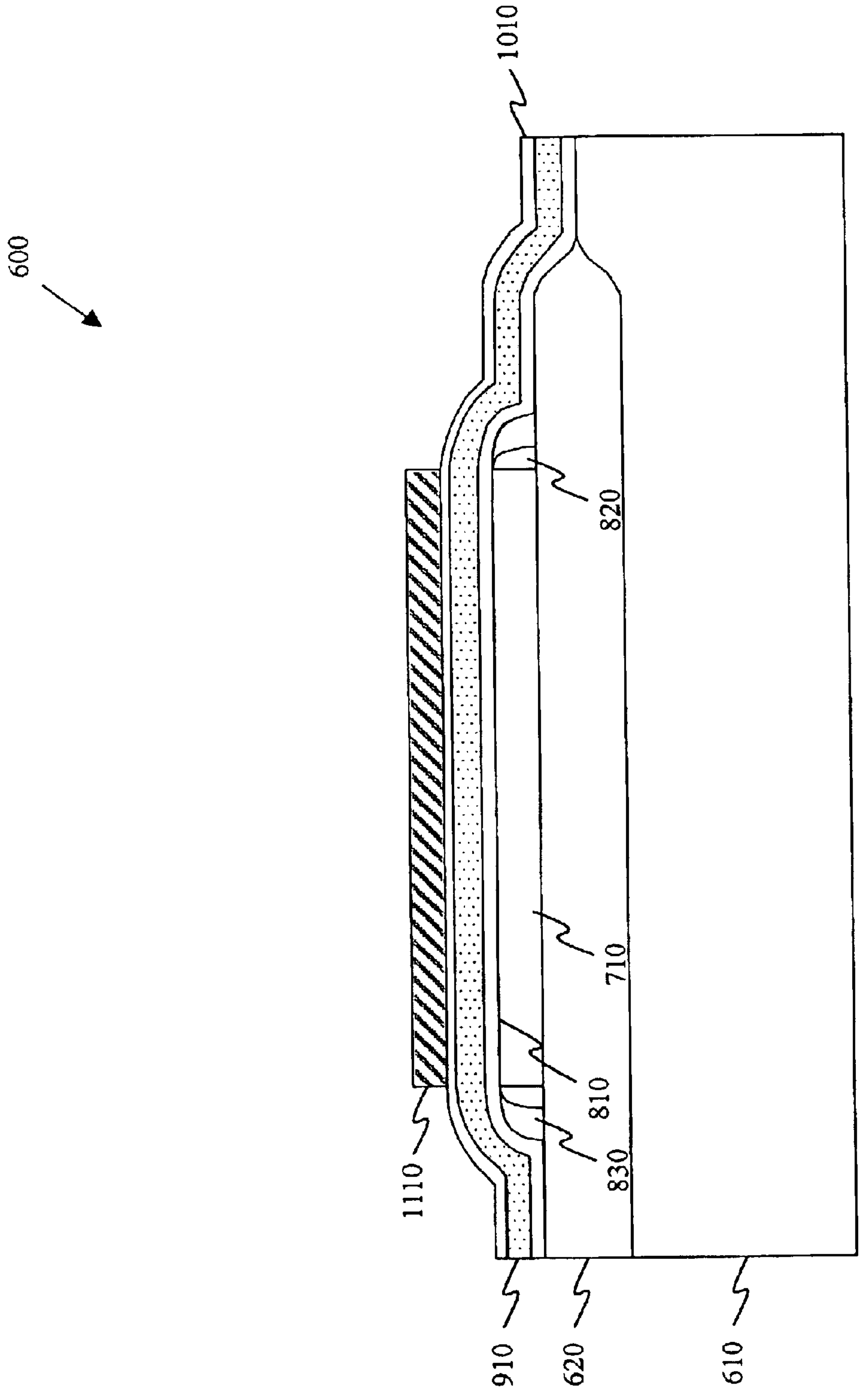
FIG. 11 illustrates a cross-sectional view of the partially completed capacitor illustrated in FIGS. 10A & 10B after forming a second conductive plate over the dielectric layer.

Turning now to FIG. 11, illustrated is a cross-sectional view of the partially completed capacitor 600 illustrated in FIGS. 10A & 10B after forming a second conductive plate 1110 over the dielectric layer 710. While the implanted Group 17 element and layer of the Group 17 element were discussed independently above, those skilled in the art understand that certain embodiments of the present invention might include the Group 17 element at both locations at the same time. For this reason, FIG. 11 is shown having both the Group 17 element included within the dielectric layer 910, as well as the layer of the Group 17 element 1010 located on the dielectric layer 910. The second conductive plate 1110, which may comprise doped polysilicon, titanium nitride or any other similar conductive material, typically has a thickness ranging from about 50 nm to about 1000 nm. Additionally, the second conductive plate 1110 may be formed using a number of different methods. After completion of the second conductive plate 1110, the capacitor 600 could be completed, resulting in a device similar to the capacitor 300 illustrated in FIG. 3.

Figure 12:
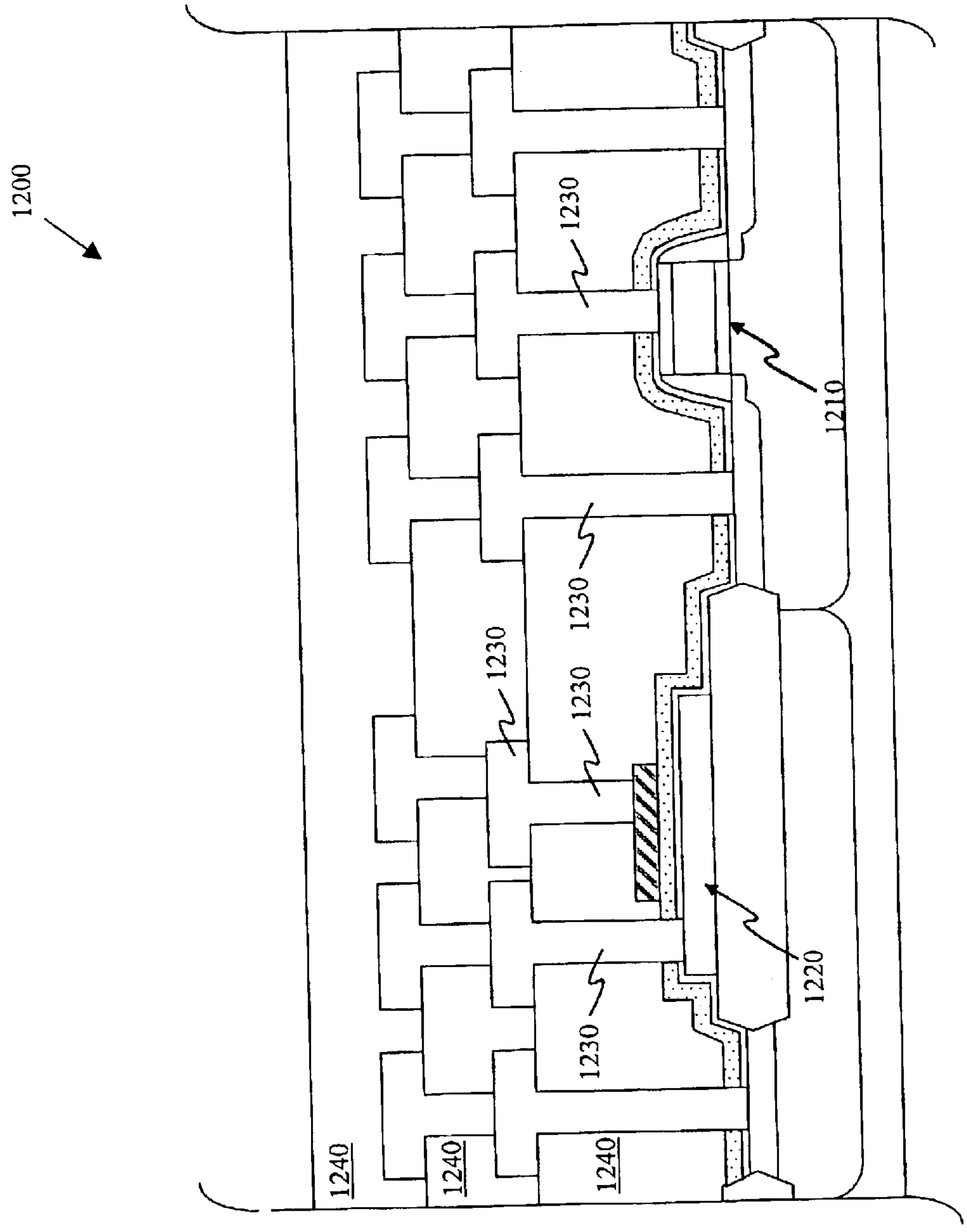
FIG. 12 illustrates a cross-sectional view of one embodiment of an integrated circuit device, which may be one environment within which a capacitor constructed according to the present invention may be incorporated.

Turning briefly to FIG. 12, illustrated is a cross-sectional view of one embodiment of an integrated circuit device 1200 which may be one environment within which a capacitor constructed according to the present invention, such as the capacitor 300 shown in FIG. 3, may be incorporated. The integrated circuit device 1200 may include active devices 1210, such as transistors used to form CMOS devices, bipolar devices, or other types of active devices. The integrated circuit device 1200 may also include other passive devices (not shown), such as inductors and resistors. Those skilled in the art are familiar with these various types of devices and their manufacture.

In the particular embodiment illustrated in FIG. 12, the integrated circuit device 1200 also includes one or more capacitors 1220, each somewhat similar to the capacitor 300 discussed above with respect to FIG. 3. The integrated circuit device 1200 also includes conventional interconnect structures 1230 located within one or more interlevel dielectric layers 1240 to interconnect the active and/or passive devices to form an operative integrated circuit.

Although the present invention has been described in detail, those skilled in the art should understand that they can make various changes, substitutions and alterations herein without departing from the spirit and scope of the invention in its broadest form.

What is claimed is:

1. A capacitor, comprising:

first and second conductive plates located over a semiconductor substrate and having a dielectric layer located therebetween;

said dielectric layer including a Group 17 element; and a dielectric absorption of less than about 155 ppm.

2. The capacitor as recited in claim 1 wherein said Group 17 element is located within said dielectric layer, said Group 17 element reducing a voltage coefficient of said capacitor.

3. The capacitor as recited in claim 2 wherein said Group 17 element is fluorine and has a concentration ranging from about 1E18 atoms/$cm^3$ to about 1E22 atoms/$cm^3$.

4. The capacitor as recited in claim 3 wherein said fluorine concentration ranges from about 1E20 atoms/$cm^3$ to about 5E21 atoms/$cm^3$.

5. The capacitor as recited in claim 2 further including a cobalt silicide layer located between said first conductive plate and said dielectric layer, and wherein a peak concentration of said Group 17 element is located at an interface between said dielectric layer and said cobalt silicide layer.

6. The capacitor as recited in claim 1 wherein said dielectric layer has a layer of said Group 17 element located thereon, said layer of said Group 17 element reducing a dielectric absorption of said capacitor.

7. The capacitor as recited in claim 6 wherein said layer of said Group 17 element has a thickness ranging from about 10 nm to about 100 nm.

8. An integrated circuit, comprising:

transistors formed over or in a semiconductor substrate;

a capacitor, including first and second conductive plates located over a semiconductor substrate and having a dielectric layer located therebetween;

said a dielectric layer including a Group 17 element;

a dielectric absorption of said capacitor of less than about 155 ppm; and interconnects contacting said transistors and said capacitor to form an integrated circuit.

9. The integrated circuit as recited in claim 8 wherein said Group 17 element is located within said dielectric layer and has a Group 17 element concentration ranging from about 1E18 atoms/$cm^3$ to about 1E22 atoms/$cm^3$, said Group 17 element reducing a voltage coefficient of said capacitor.

10. The integrated circuit as recited in claim 8, wherein said dielectric layer has a layer of said Group 17 element located thereon and said layer of said Group 17 element has a thickness ranging from about 10 nm to about 100 nm, said layer of said Group 17 element reducing a dielectric absorption of said capacitor.

11. The integrated circuit as recited in claim 8 wherein said transistors are selected from the group consisting of:

MOS transistors;

CMOS transistors;

Junction Field Effect transistors;

bipolar transistors; and biCMOS transistors.

12. The integrated circuit as recited in claim 8 further including a resistor located said semiconductor substrate.

* * * * *